United States Patent [19]

Bush

[11] Patent Number: 4,954,953
[45] Date of Patent: Sep. 4, 1990

[54] MACHINE PROCESS FOR CONVERTING ONE REPRESENTATION OF AN ELECTRONIC INTEGRATED CIRCUIT INTO ANOTHER REPRESENTATION

[75] Inventor: Steve Bush, Mountain View, Calif.

[73] Assignee: VLSI Technology, Inc., San Jose, Calif.

[21] Appl. No.: 178,574

[22] Filed: Apr. 7, 1988

[51] Int. Cl.⁵ .................. G06F 15/20; G06F 15/60
[52] U.S. Cl. ................................ 364/578; 364/489
[58] Field of Search ............ 364/200, 900, 578, 488, 364/489

[56] References Cited

U.S. PATENT DOCUMENTS

| 4,725,970 | 2/1988 | Burrows et al. | 364/578 |
| 4,744,084 | 5/1988 | Beck et al. | 364/578 |
| 4,763,289 | 8/1988 | Barzilai et al. | 364/578 |

*Primary Examiner*—Felix D. Gruber
*Attorney, Agent, or Firm*—Limbach, Limbach & Sutton

[57] ABSTRACT

A digital computer having stored therein a program receives information on pin locations, logic equations and timing delays from a plurality of inputs to a plurality of outputs of a representation of an electronic integrated circuit. A first representation of the electronic integrated circuit is constructed by the program based upon the input information. The first representation has a plurality of nodes interconnecting a plurality of first electronic logic circuit elements, with the first electronic logic circuit elements in the primitives of a first simulator. The first representation is transformed into a second representation which is the logical equivalent of the first representation in accordance with the following rules: All directly serially connected first electronic logic circuit elements that can be collapsed are collapsed; and a first electronic logic circuit element which is not recognized as a primitive by a second simulator is transformed or expanded into equivalent logical elements which are primitives of the second simulator; provided that the second representation does not comprise directly serially connected primitives. The timing delay for each electronic logic circuit element in the second representation is determined. The electronic logic circuit elements in the second representation are converted into a third representation which are in primitives of the second simulator. The third representation is then generated in the syntax of the second simulator.

6 Claims, 4 Drawing Sheets

Microfiche Appendix Included
(2 Microfiche, 196 Pages)

$E = (-(A * B) + C) + D$

MACHINE PROCESS FOR CONVERTING ONE REPRESENTATION OF AN ELECTRONIC INTEGRATED CIRCUIT INTO ANOTHER REPRESENTATION

This application is submitted with a microfiche appendix, Exhibit A, containing copyrighted material, Copyright 1988 VLSI Technology, Inc. The appendix consists of two (2) microfiche and 196 frames. The copyright owner has no objection to the facsimile reproduction by any one of the patent documents or the patent disclosures, as it appears in the U.S. Patent & Trademark Office's patent files or records, but otherwise reserves all copyrights whatsoever in the appendix.

TECHNICAL FIELD

The present invention relates to a machine process and more particularly to a machine process using a programmed digital computer having a program stored therein, for converting a behavioral representation of an electronic integrated circuit into another behavioral representation of the same electronic integrated circuit.

BACKGROUND OF THE INVENTION

There are many types of representations of electronic integrated circuits, e.g. physical layout, schematic etc. One representation is a simulation model which is a representation of the behavioral of an electronic integrated circuit. In the area of Application Specific Integrated Circuits (ASIC), behavioral representations of electronic integrated circuits are stored in a model, which is adapted to be executed under a simulator, also software. Each of the basic building blocks in an ASIC electronic integrated circuit is termed a macro or a cell. In ASIC applications, macros or cells from a library or libraries are compiled or connected together to form the desired electronic integrated circuit.

Each macro or cell in the ASIC library has a plurality of nodes interconnecting a plurality of electronic logic circuit primitive elements. The logic circuit primitive elements can comprise elements such as NAND gates, OR gates, AND gates, NOR gates, or even flip flops. Further, in many ASIC libraries, the timing for each macro or cell is specified only between the inputs to the macro and the outputs from the macro.

The problem heretofore is that ASIC libraries developed by the developer of the library have been constrained to operate on one type of simulator. Heretofore, a user of the ASIC library must either go to the facility of the ASIC developer to use the one type of simulator or acquire the same one type of simulator in its own facilities and obtain rights to use the ASIC library from the ASIC developer. Alternatively, the ASIC library can be manually converted to operate from one simulator to another simulator.

As the price of digital computers decrease and their processing capabilities increase, the user becomes more desirous of having a digital computer or work station at the user's facility to use the ASIC library. In many instances, however, the user digital computer or user work station has a simulator executing thereon, which is different from the simulator under which the ASIC library would operate. Thus, the ASIC library developed by the ASIC library developer for use on one simulator must be converted to work on a second simulator. The conversion must take into account three factors which differentiate one simulator from another: language, primitives and timing.

Language is the text or commands by which an operator, using the particular simulator, commands the simulator to operate on the particular macro or cell from the ASIC library. Thus, to operate on a nand gate, one simulator may require the command "A nand B" whereas another simulator may require the command "—(A*B)". Included in language is syntax. Syntax is the grammatical rules of the language. One simulator may require the presence of a ";" as a delimiter and another simulator may require a different delimiter. These are merely simplistic examples of differences in language from the simulator developed by the provider of the ASIC library to the user's simulator.

Primitives are the basic logical element which are understood by a simulator. All simulators have a set of primitives which the simulators recognize. All of the members of a set of primitives which a first simulator recognizes or understands, may not be all of the same members which are recognized or understood by a second simulator. Thus, some simulators cannot understand an XOR gate. Others do not understand a MUX. In converting the ASIC library which is executable under the developer simulator, to that which is executable under the user simulator, there may be cells with logic elements which are not primitives of the user simulator and therefore would not be understood by the user simulator. In addition, there may be primitives on the user simulator better suited to the cell but not available on the developer simulator.

Finally in converting the ASIC library, timing must be considered. In the developer's simulator, timing is specified as the delays from the inputs to the macro to the outputs of the macro. However, in many of the user simulators, timing must be specified for each of the nodes or the primitives within each of the cells or macros. Thus, it is not sufficient to simply specify the timing delays from the inputs of the macro to the outputs of the macro. The conversion program must allocate the timing delays to each of the primitives that make up the cell in the library.

SUMMARY OF THE INVENTION

In the present invention, a machine process for converting a behavioral representation of an electronic integrated circuit from one form to another form is disclosed. The behavioral representation of the electronic integrated circuit, in one form, has a plurality of inputs and a plurality of outputs, and a plurality of nodes interconnecting a plurality of logical elements, which are in the primitives of a first simulator. The converted behavioral representation in another form, is generated for further processing by a second simulator and is in the primitives and in the syntax of the second simulator. The method comprises the steps of inputting into the machine process of the present invention, pin locations, logic equations and behavioral description, and timing delays from the inputs to the outputs of the electronic integrated circuit, whose representation is to be converted. A first representation of the electronic integrated circuit is constructed, based upon the pin locations, logic equations, and timing delays. The first representation has a plurality of nodes interconnecting a plurality of logical elements, which are in the primitives of the first simulator. The first representation is transformed into a second representation which is a logical equivalent of the first representation. The transformation is done in accordance with the laws of boolean algebra, and optimized to contain the fewest number of primitives, under the constraint that all primitives used must be recognized or understood by the second simulator. Thus, primitives of the first simulator which are not recognized or understood by the second simulator are transformed into logical equivalents and in the primitives which are understood by the second simulator, except for those primitives of the first simulator, which result in directly connected serial expansion primitives of the second simulator. The timing delay for each primitive in the second representation is determined. The second representation is then converted into a third representation by converting all of the primitives in the second representation which have not been converted into the primitives of the second simulator. Finally, the third representation is generated in the syntax of the second simulator.

BRIEF DESCRIPTION OF THE DRAWINGS

FIG. 2C is a third representation of the electronic integrated circuit cell of FIG. 2A, which is in the primitive, language and timing of the second simulator.

FIG. 3C is the third representation of the electronic integrated circuit shown in FIG. 3A.

DETAILED DESCRIPTION OF THE DRAWINGS

Figure 1:
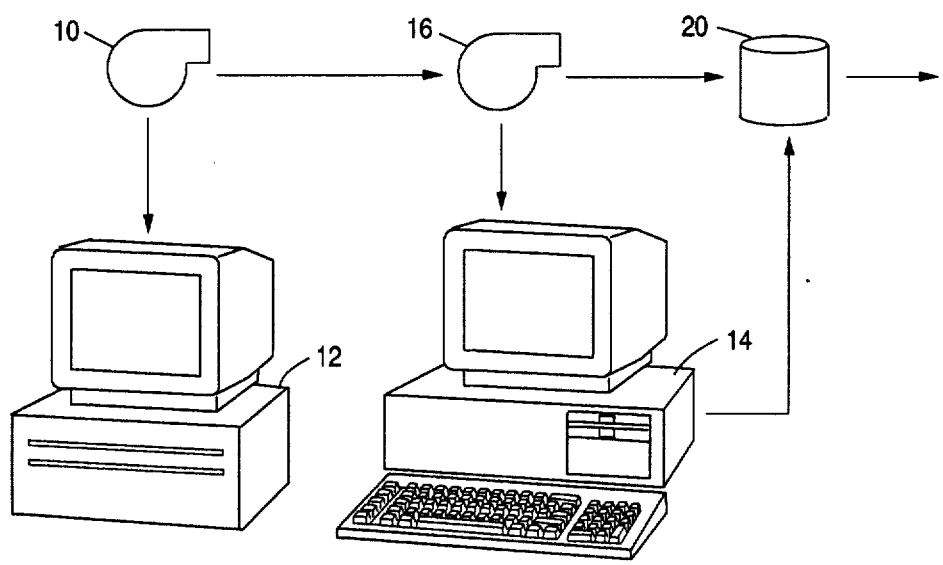
FIG. 1 is a schematic drawing of the overall process of the present invention to convert behavioral representation of electronic integrated circuits from being executable under a first simulator to a second simulator.

Referring to FIG. 1, there is shown a schematic block diagram of the flow of information as used in the method of the present invention. In the present invention, a library 10 of macros or cells developed, for example, by the assignee of the present invention VLSI Technology, Inc. of San Jose, Calif., is adapted for use on the developer computer 12, which is an Apollo Computer, Model DN4000, executing a first simulation program VTIsim. In the library 10 of macros or cells are representations of electronic integrated circuits, each having a plurality of nodes interconnecting a plurality of electronic logic circuit elements, which are primitives of the first simulation program. Each macro has a plurality of inputs and a plurality of outputs with a plurality of timing delays associated with each macro representing the delays between the inputs and the outputs to the macro.

As previously stated, with the advent of low cost engineering digital computers or work stations, the users of the macro library 10 can now own or lease or have access to their own digital computer 14. Typically, the user digital computer 14 may not and in most cases does not use the same simulation program as the first simulation program developed by the developer of the library 10. Thus, in order for the user computer 14, with its second simulation program to be able to use the library 10, the library 10 must be converted into the user library 16 in order that the second simulation program on the user computer 14 can effectively use them. As previously stated, the conversion of the library 10, executable under the first simulation program, into the user library 16, executable under a second simulation program, entails conversion in the areas of language, primitives and timing.

Once the user library 16 is available, then the second simulation program on the user computer 14 can use the user library 16 to form various behavioral representations of customized integrated circuits 20 for its use. The behavioral representations can include functions such as MUX, NAND, XOR, etc.

The method of the present invention is the conversion of the macros or cells in the developer library 10 into the user library 16. The method is accomplished by the use of a digital computer with a program stored therein. A copy of the program for the conversion is attached herewith as Exhibit A. The attached program is executable under MainSail, Version 11. A flow chart shown in the operation of the program as set forth in Exhibit A is shown in Exhibit B.

In the method of the present invention, information or data on pin locations, logic equations, and timing delays, of each macro in the developer library 10, is inputted into the program to be used by the program. A copy of the program is set forth on the attached microfiche.

For each macro of the developer library 10 that is converted into the user library 16, the program generates a first representation of the electronic integrated circuit. The first representation has a plurality of nodes interconnecting a plurality of first electronic logic circuit elements. The first electronic logic circuit elements are in the primitives of the first simulation program.

The first representation is transformed into a second representation which is the logical equivalent of the first representation. The rules of the transformation are as follows. All directly serially connected logical circuit elements that can be changed are changed. Thus an AND gate connected to an INVERTER is converted into a NAND gate. This is done even if it results in an electronic circuit element which is not one of the primitives of the second simulation program. Similarly, an electronic logic circuit element in the macro of the developer library 10 which is not recognized as a primitive by the second simulation program is transformed or expanded into equivalent logical circuit elements which are primitives of the second simulation program; provided that if this results in the expansion into a plurality of directly serially connected primitives, then the expansion is not performed.

Thereafter, the timing delay for each of the electronic logic circuit elements of the second representation is determined. The second representation is then converted into a third representation with the third representation being all in the primitives of the second simulator executing under the user digital computer 14. Finally, the third representation is then generated in the syntax of the second simulator.

To determine the timing delay for each electronic circuit logic circuit element of the second representation, the program finds a list of all possible paths from each input to each output of each electronic logic circuit element. The program derives a plurality of simultaneous equations where one variable is for each timing at each circuit element and one equation is derived for each route from an input to the macro to an output of the macro. Using the Simplex method, a solution is determined. With the Simplex method, which is well known, there may be a perfect fit to the data, or in the case of data which cannot be perfectly fit to the given set of constraints, there may be a best fit with a minimal difference from the required timings. This solution is then used to give the timings for each logic circuit primitive element.

Figure 4A:
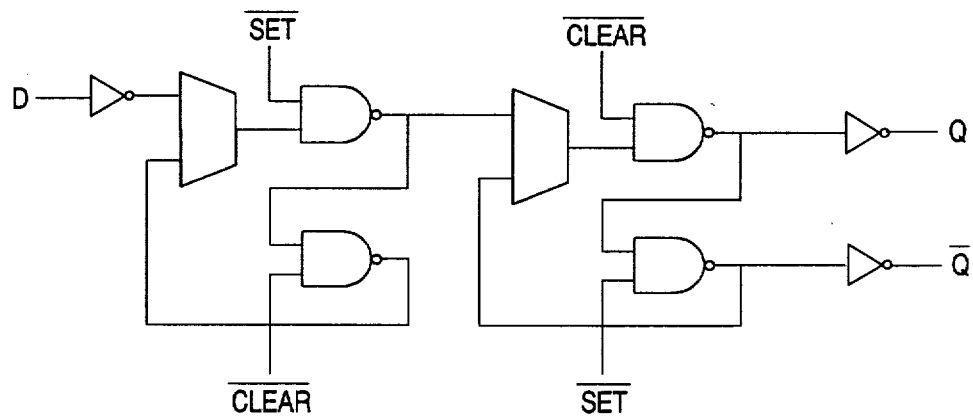
FIG. 4A is a schematic block diagram of one flip-flop representation of a flip-flop as used in a method of the present invention.

In a variation of the method of present invention, where the macro or the cell is a flip-flop, the program creates approximately twelve (12) different flip-flop representations for each flip-flop. Each flip-flop representation has one or more primitives of the first simulator, which are interconnected. One example of a flip-flop representation is shown in FIG. 4A. This flip-flop representation is then operated upon in the same manner as previously described. After the timing equations are solved, if the solution is perfect, then the program stops. If the solution is not perfect, the program goes back and substitutes another flip-flop representation. The process of operation, in the same manner as previously described, is continued. If the solution is not perfect, another flip-flop representation is chosen. If all twelve (12) flip-flop representations are tried with no resultant perfect solution, then the flip-flop representation yielding the best solution is chosen.

Figure 4B:
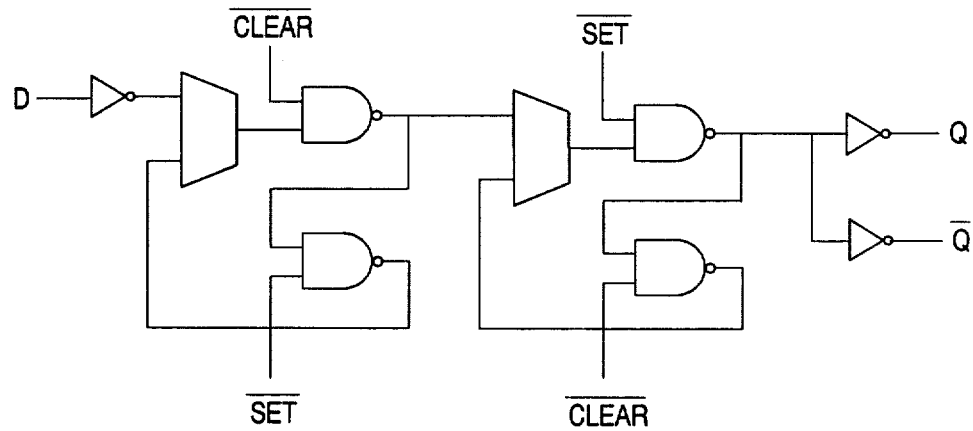
FIG. 4B is a schematic block diagram of another flip-flop representation of a flip-flop.
Figure 5A:
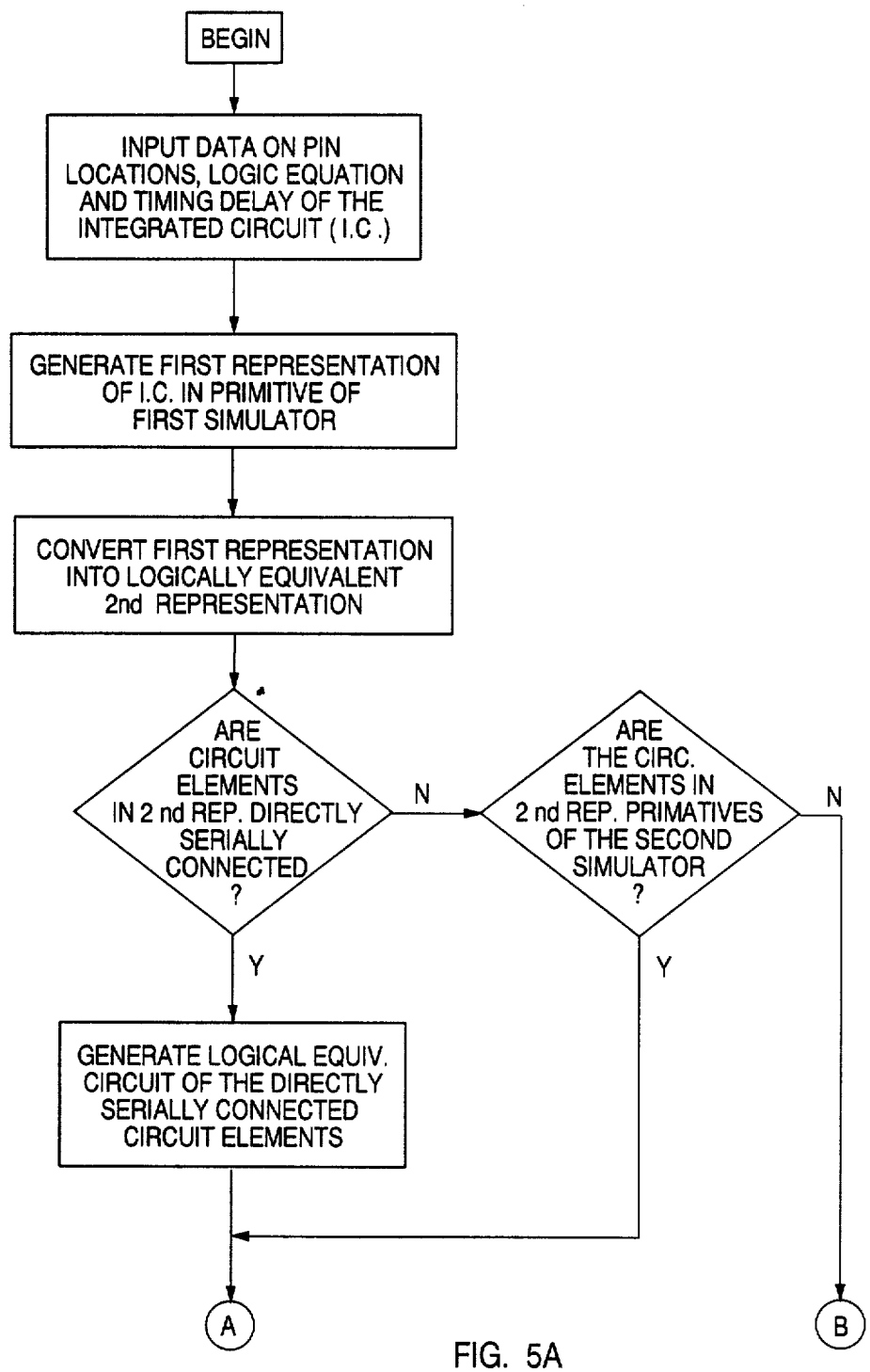
FIG. 5(a&b) show a flow chart of the program which is set forth on the microfiche.
Figure 5B:
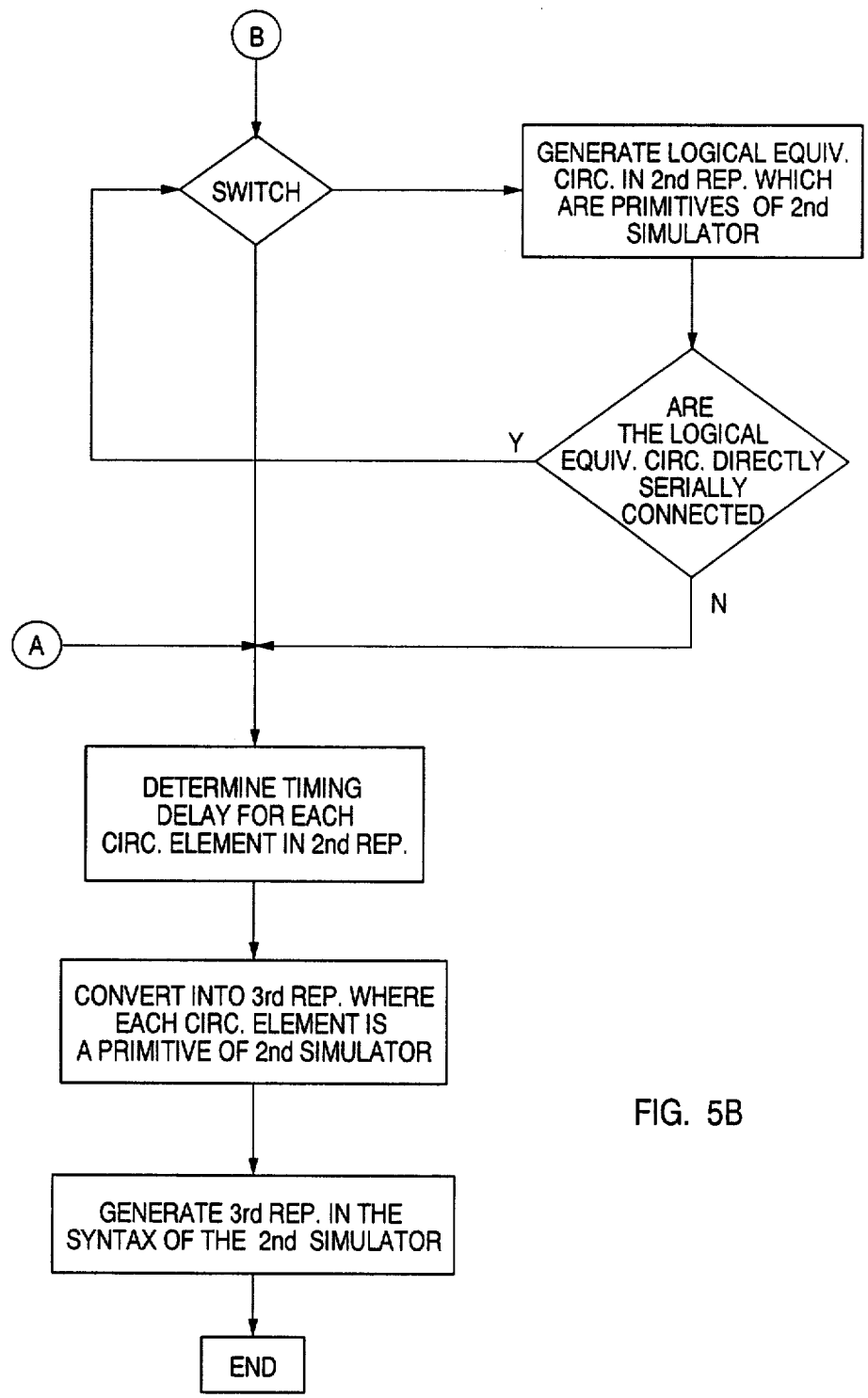

Referring to FIG. 4B, there is shown another flip-flop representation.

Figure 2A:
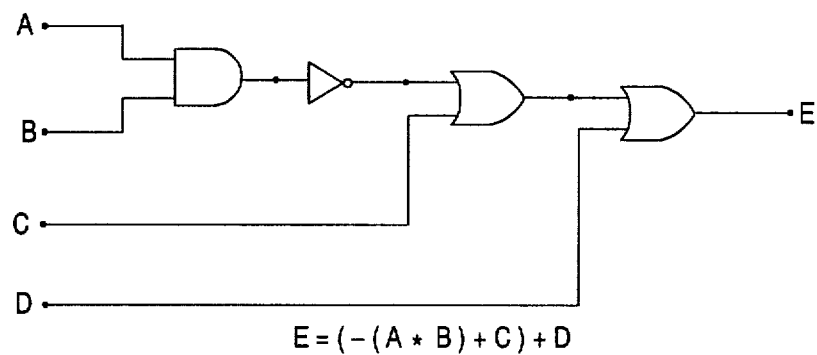
FIG. 2A is an example of a macro or cell which is constructed by the method of the present invention which is the first representation of an electronic integrated circuit based upon the input information into the method of the present invention.
Figure 2B:
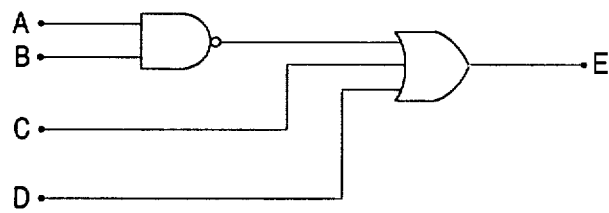
FIG. 2B is a second representation of the electronic integrated circuit of FIG. 2A transformed in accordance with the rules of the method of the present invention.

Referring to FIG. 2A, there is shown an example of a macro or a cell in the first representation. Here, the subexpression "—(A*B)" has been represented by a NOT gate following an AND gate. This sub-structure is compacted into a single NAND gate in the second representation shown in FIG. 2B. Even if the second simulator does not support NAND gates, this would be done; in that case, after timing is distributed by the method of the present invention, the NAND gate would be re-expanded back into gates supported by the second simulator, such as a NOT gate following an AND gate. Additionally, the two OR gates in the first representation (FIG. 2A) are compacted into a single OR gate in the second representation (FIG. 2B).

The third representation, shown in FIG. 2C, is, in this case, the EDIF language code generated by the program.

Figure 3A:
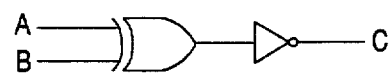
FIG. 3A is a first representation of another example of a macro or cell constructed in accordance with the method of the present invention, which is the first representation of an electronic integrated circuit based upon the input information into the program.
Figure 3B:
FIG. 3B is a second representation of the electronic integrated circuit shown in FIG. 3A.

FIG. 3A shows another cell, define logically by "C —NOT (A XOR B)". In the first representation, it is shown as a NOT gate following a XOR gate. In the second representation (FIG. 3B), it is compacted into a single XNOR gate. The third representation (FIG. 3C), is the same cell as generated for the DAISY SPARC language. Note that DAISY SPARC does not support XNOR, so a more complex transformation has taken place in this third representation.

What is claimed is:

1. A machine process for converting a behavioral representation of an electronic integrated circuit from one form to another form; said behavioral representation of the electronic integrated circuit, in one form, has a plurality of inputs and a plurality of outputs, and a plurality of nodes interconnecting a plurality of logical elements, which are in the primitives of a first simulator; said behavioral representation in another form is generated for further processing by a second simulator and is in the primitives and in the syntax of the second simulator; said machine process being implemented by the use of a programmed digital computer having stored therein a program; said method comprising the steps of:
    (a) inputting data on pin locations, logic equation and timing delays from said inputs to said outputs of said electronic integrated circuit, into said program;
    (b) generating a first representation of said electronic integrated circuit based upon said data on said pin locations, logic equation and timing delays, said first representation having a plurality of nodes interconnecting a plurality of first electronic logic circuit elements, each of said elements is a primitive of said first simulator;
    (c) converting said first representation into a second representation, which is a logical equivalent of said first representation, in accordance with the rules of boolean algebra, and in accordance with the following:
        (i) changing representations of all directly serially connected first electronic logic circuit elements into a representation of a second electronic logic circuit element;
        (ii) changing said first electronic logic circuit elements into electronic logic circuit elements of said second representation, which are primitives of said second simulation program, but which are not directly serially connected primitives;
    (d) determining the timing delay for each electronic logic circuit element of said second representation;
    (e) converting said second representation into a third representation by converting all of the electronic logic circuit elements of said second representation into primitives of said second simulation program; and
    (f) generating said third representation in the syntax of said second simulation program for further processing by said second simulation program.

2. The method of claim 1 wherein said determining step further comprises:
    (a) determining all possible signal paths from said input to said output;
    (b) forming a set of simultaneous equations with a variable for each timing delay for each electronic logic circuit element, and one equation for each signal path;
    (c) solving said set of simultaneous equations for each variable.

3. The method of claim 2, wherein said solving step comprises:
    minimizing the error in a Simplex algorithm solution of said set of simultaneous equations.

4. The method of claim 3 wherein said logic equation specifies a flip-flop.

5. The method of claim 4 further comprising the step of creating a plurality of representations for each flip-flop, with each one of said plurality of representations comprising one or more interconnected primitives of said first simulator;

using one of said plurality of representations in said first representation generated.

6. The method of claim 5, in the event said error in a Simplex algorithm solution is non-zero, further comprising the following steps:
   (a) forming a first representation of another flip-flop;
   (b) transforming said first representation of step (a) in accordance with the rules of boolean algebra, and in accordance with the following:
      (i) changing representations of all directly serially connected first electronic logic circuit elements into a representation of a second electronic logic circuit element;
      (ii) changing said first electronic logic circuit elements into electronic logic circuit elements of said second representation, which are primitives of said second simulation program but which are not directly serially connected primitives;
   (c) determining the time delay for each electronic logic circuit element of said second representation;
   (d) repeating the steps (a) and (b) herein in the event said error in a Simplex algorithm solution is non-zero; and
   (e) continuing with the following steps otherwise,
      (i) converting said second representation into a third representation by converting all of the electronic logic circuit elements of said second representation into primitives of said second simulation program; and
      (ii) generating said third representation in the syntax of said second simulation program.

* * * * *